United States Patent [19]
Wada et al.

[11] Patent Number: 4,841,353
[45] Date of Patent: Jun. 20, 1989

[54] TRANSISTOR DEVICES FOR MICROWAVE OSCILLATOR ELEMENTS

[75] Inventors: Kenzo Wada; Eiji Nagata, both of Tokyo, Japan

[73] Assignee: NEC Corporation, Tokyo, Japan

[21] Appl. No.: 129,390

[22] Filed: Nov. 24, 1987

Related U.S. Application Data

[63] Continuation of Ser. No. 753,092, Jul. 9, 1985, abandoned.

[30] Foreign Application Priority Data

Jul. 10, 1984 [JP] Japan .................. 59-141375

[51] Int. Cl.$^4$ .......................................... H01L 27/02
[52] U.S. Cl. .................................. 357/51; 357/65;
357/22; 331/117 FE; 331/115; 331/36 L;
331/34; 331/1 R; 333/247; 336/232; 336/225
[58] Field of Search ............... 331/117 FE, 115, 36 L,
331/1 R, 34; 333/247; 357/51, 65, 22 H;
336/232, 225

[56] References Cited
U.S. PATENT DOCUMENTS 3,969,752  7/1976  Martin et al. ..................... 357/51
4,353,047  10/1982 Noguchi et al. ................. 333/247
4,630,003  12/1986 Torizuka et al. ............ 331/117 FE

FOREIGN PATENT DOCUMENTS 55-151372  11/1980  Japan ............................ 357/51
56-155575  12/1981  Japan ............................ 357/51
57-24101   2/1982   Japan ........................... 333/247
57-115852  7/1982   Japan .

Primary Examiner—Rolf Hille
Assistant Examiner—William A. Mintel
Attorney, Agent, or Firm—Sughrue, Mion, Zinn, Macpeak & Seas

[57] ABSTRACT

A transistor device for a microwave oscillating element having an FET transistor chip and a package encapsulating the chip therein. In order to avoid any affection of the external circuit to the input impedance of the transistor device and to make the phase rotation low at a frequency band higher than the X band, a conductor element is provided within the package to connect the drain electrode of the chip and a corresponding terminal of the package. The conductor element has an inductance to provide a sufficient high impedance at the intended frequency band. The conductor element is supported on an insulator plate fixedly mounted within the package.

8 Claims, 3 Drawing Sheets

TRANSISTOR DEVICES FOR MICROWAVE OSCILLATOR ELEMENTS

This is a continuation of application Ser. No. 753,092, filed July 9, 1985, now abandoned.

BACKGROUND OF THE INVENTION (1) Field of the Invention

The present invention relates to transistor devices and, in particular, to those which can be used for microwave oscillators above X band.

The X band is a radio frequency band extending from 5,200 to 10,900 MHz.

(2) Description of the Prior Art

In the prior art, a microwave oscillator uses a transistor device as an oscillating element, which comprises a transistor chip, such as gallium-arsenide Schottky-Barrier gate field-effect transistor (GaAs FET) or silicon (Si) transistor, and a package encapsulating the transistor chip. The package is provided with three terminals, that is, a control terminal, an output terminal, and a ground terminal which is a bottom plate of the package. The transistor chip having three terminals is fixedly mounted on the ground terminal so that one electrode (collector in Si transistor, source in FET) of the transistor chip is directly connected to the ground terminal. The other two electrodes of the chip (base and emitter in Si transistor, gate and drain in FET) are connected to the control terminal and the output terminal by bonding wires, respectively.

Due to inductances of the bonding wires and capacitances of the terminals, an available transistor device for the microwave oscillating element has difficult problems for use in oscillators at a frequency band higher than the X band. That is, it is required for the negative resistance to adjust impedance of external circuit elements connected to the transistor device. Even if the negative resistance can be obtained, the phase rotation is fast so that oscillation cannot be stabilized over a wide frequency band.

SUMMARY OF THE INVENTION

It is an object of the present invention to provide a transistor device for an oscillating element wherein its input impedance as viewed from the control terminal has a negative resistance characteristics which has no relation to affecting any external circuit connected thereto, and the phase rotation is low at an intended frequency band so that the stabilized oscillation is insured by the use of the transistor.

It is another object of the present invention to provide a transistor device for an oscillating element at a frequency band higher than X band which uses an available transistor chip used in the known microwave oscillating element.

It is still another object of the present invention to provide such a transistor device which is simple in construction and producing method.

A known transistor device for a microwave oscillating element comprises a transistor chip, such as FET chip or Si transistor chip, having three electrodes and a package having three terminals corresponding to the three electrodes. The transistor chip is encapsulated within the package. A control electrode and an output electrode of the three electrodes of the chip are connected to the corresponding two terminals of the package by bonding wires, respectively. According to the present invention, an insulator plate means is fixedly mounted adjacent the chip within the package, and a conductor element is supported on the insulator plate means. The conductor element has opposite ends which are connected to the output electrode of the chip and the corresponding terminal of the package by bonding wires. The conductor element is previously adjusted to have an inductance to provide a high impedance at an intended frequency band.

In an aspect of the present invention, the conductor element can be made of a wire which is bonded at a plurality of positions to a plurality of conductive pads formed on an insulator plate means. The insulator plate means can comprise a plurality of separate plate sections.

In another aspect of the present invention, the conductor element can be a micro-strip line formed on the insulator plate means.

Further objects, features and other aspects of the present invention will be understood from the following detailed description of preferred embodiments referring to the accompanying drawings.

DETAILED DESCRIPTION OF PREFERRED EMBODIMENTS

Prior to description of embodiment of the present invention, a known available transistor device for the microwave oscillating element will be explained referring to FIGS. 1–4.

Figure 1:
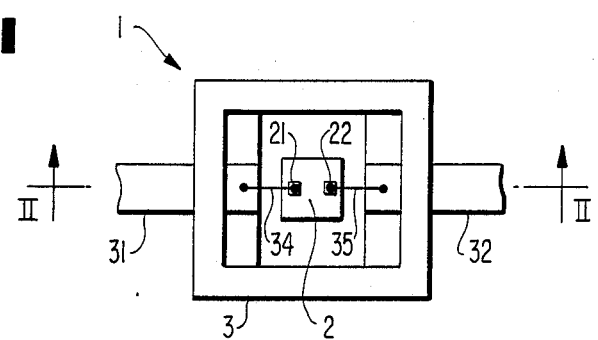
FIG. 1 is a plan view of a known and available transistor device for a microwave oscillating element, with a package cap being omitted.
Figure 2:
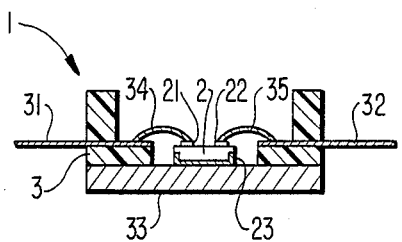
FIG. 2 is a sectional view of the known transistor taken along a line II—II in FIG. 1.

Referring to FIGS. 1 and 2, the transistor device 1 shown therein comprises a transistor chip such as GaAs FET 2 and a package 3. A cap of the package is omitted for viewing the interior. The package 3 has two wire terminals 31 and 32 and a ground plate terminal 33 which is a bottom plate of the package. The transistor chip 2 is provided with three electrodes 21–23 and is fixedly mounted onto ground plate terminal 33 of the package so that one electrode 23, usually source electrode, is directly connected to the ground plate terminal. The other electrodes, that is, gate electrode 21 and drain electrode 22, are connected to wire terminals 31 and 32 by bonding wires 34 and 35, respectively.

FET transistor is usually used in a condition where the source is grounded, but the drain is alternatively grounded in one case, for example, for use in a band-reflex oscillator.

Since the drain and the source of an FET can be changed to each other in practical use as well known in the prior art, the terminal 32 of transistor device 1 in FIGS. 1 and 2 can be used for a source electrode terminal with the plate terminal 33 being for a drain electrode terminal. Thus, the transistor device 1 can be used in a condition where the drain is grounded as shown in FIG. 3.

Figure 3:
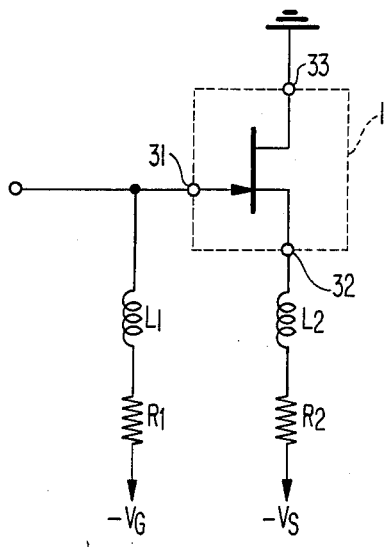
FIG. 3 is a bias circuit of the transistor used in a condition where the drain is grounded.

Referring to FIG. 3, terminal 33 of the transistor device 1 is grounded, and terminals 31 and 32 are connected to bias sources $-V_G$ and $-V_S$ through choking coils $L_1$ and $L_2$ and biassing resistors $R_1$ and $R_2$, respectively.

In the circuit as shown in FIG. 3, the electrode 22 of transistor chip 2 is used as a source electrode while the electrode 23 is used as a drain electrode.

Figure 4:
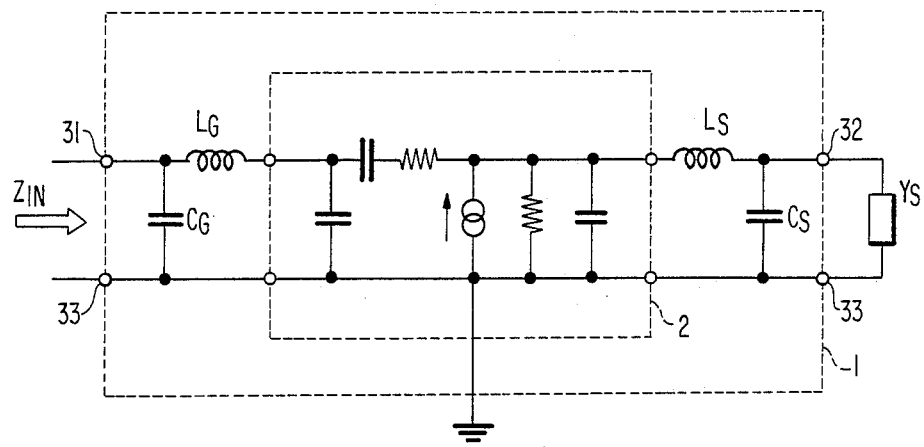
FIG. 4 is a view illustrating an equivalent circuit of FIG. 3.

The circuit of FIG. 3 is represented by an equivalent circuit in FIG. 4. In the figure, a circuit within a chained-line block 2 is an equivalent circuit of the transistor chip as well known in the prior art. $L_G$ and $L_S$ are inductances of bonding wires 34 and 35. $C_G$ and $C_S$ are capacitances of wire terminals 31 and 32. $Y_S$ is a susceptance of an external circuit including circuit elements such as choking coils $L_1$ and $L_2$ and resistances $R_1$ and $R_2$.

In use of the transistor device 1 as an oscillating element, the input impedance $Z_{in}$ of the transistor device 1 as viewed from the gate terminal 31 must have a negative resistance characteristics.

However, available transistor devices for microwave oscillating elements cannot provide the negative resistance characteristics without appropriately selecting the susceptance $Y_S$ of the external circuit for use in oscillators above the X band. Even if the susceptance $Y_S$ is appropriately selected so that the negative resistance characteristic can be obtained, the phase rotation is fast due to inductance $L_S$ (usually, 0.2-0.5 nH) and capacitance $C_S$ (usually, 0.3-0.6 pF) so that the stabilized oscillation cannot be obtained over a wide frequency band.

According to the present invention, a transistor device as the microwave oscillating element can be obtained which has the negative resistance characteristic which has no relation to the external circuit and with a slow phase rotation above the X band.

Figure 5:
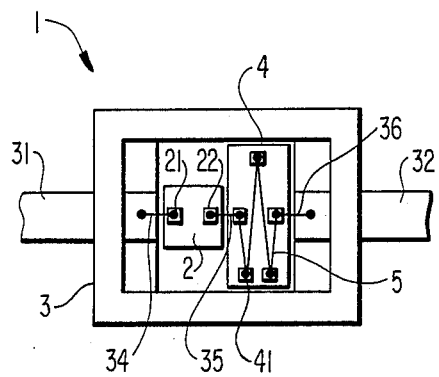
FIG. 5 is a plan view of an embodiment of the present invention, with the package cap being omitted similar to FIG. 1.

Referring to FIG. 5, an embodiment 1' shown therein is similar to the device 1 of FIG. 1 but is characterized by provision of an insulator plate 4 having a conductor 5 thereon. The similar parts are represented by the same reference numerals as in FIG. 1. The transistor device 1' can be used in the bias circuit similar to FIG. 3.

The insulator plate 4 is made of alumina ceramic or other insulator materials, and is provided with a plurality of conductive pads 41 (five pads are shown). The insulator plate 4 is fixedly mounted adjacent chip 2 within package. The conductor 5 is of a wire which is bonded at a plurality of positions to conductive pads 41. The opposite ends of wire 5 are connected to electrode 22 of transistor chip 2 and output terminal 32 by bonding wires 35 and 36.

The length of the wire 5 should be selected to have an inductance to provide a sufficient high impedance at an intended frequency above the X band. In detail, providing that an inductance of the wire 5 including bonding wires 35 and 36 is $L_S'$, the inductance $L_S'$ should be selected to meet the following formula:

$$f >> \frac{1}{2\pi \sqrt{L_S' C_S}},$$

where f is an intended frequency.

For example, when capacitances $C_G$ and $C_S$ of terminals 31 and 32 are about 0.4 pF while inductance $L_G$ of bonding wire 34 being 0.3 nH similar to the available transistor device, and when the inductance $L_S'$ is selected to be 4 nH higher than $L_S$ (=0.2-0.5 nH) of the available transistor device, the input impedance $Z_{in}$ as viewed from the gate terminal 31 has the negative resistance characteristic, and the phase rotation is low even at a frequency higher than X band. Further, since the inductance $L_S'$ is high, the input impedance $Z_{in}$ is almost not affected by the susceptance of the external circuit connected to the terminal 32.

Figure 6:
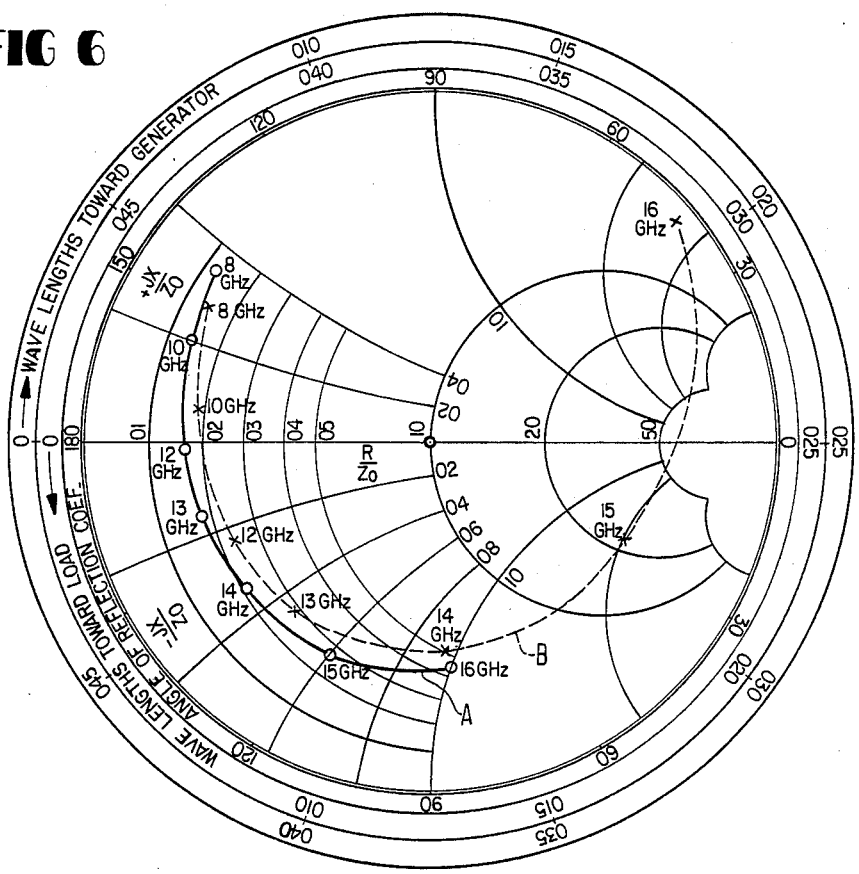
FIG. 6 is the Smith chart illustrating input impedances of the embodiment at different frequencies.

The input impedance $Z_{in}$ of the above-described transistor device according to the present invention, was measured at different frequencies. Referring to FIG. 6, the measured data are drawn on the Smith chart by a solid line curve A. Another curve B by a dashed line represents the input impedances of the available transistor device for the oscillating element which were measured at the same frequencies.

It will be noted from FIG. 6 that the transistor device of the present invention is superior to the available one at frequencies higher than the X band.

Figure 7:
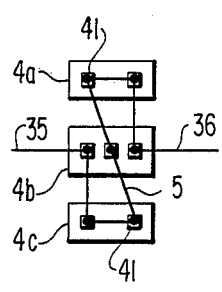
FIG. 7 is a plan view of a main part of another embodiment.

Referring to FIG. 7, a plurality of insulator plates 4a–4c having conductive pads 41 can be used, in place of a single plate, and the conductor wire 5 is bonded to conductive pads 41 of the plurality of plates 4a–4c.

Figure 8:
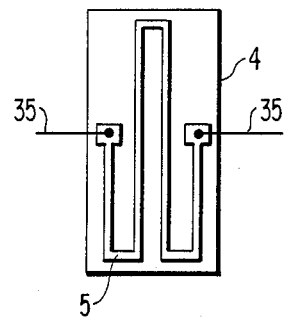
FIG. 8 is a plan view of a main part of still another embodiment.

Referring to FIG. 8, the conductor 5 can be a microstrip line formed on the insulator plate 4.

It will be easily understood by those skilled in the art that the present invention can be applied to a transistor device having not only an N-channel FET chip but also a P-channel FET chip, and also applied to a transistor device having a Si transistor chip.

What is claimed is:

1. In a transistor device for use in oscillating an electric signal at a frequency comprising a transistor chip having three electrodes and a package having three terminals corresponding to the three electrodes, said transistor chip being encapsulated within said package, a control electrode of the three electrodes of said transistor chip being connected to a first of the three terminals by a bonding wire within said package, an output electrode of the three electrodes being coupled with a second of three terminals, the transistor device having an input impedance reviewed from the first terminal as an input terminal at said frequency, the improvement which comprises an insulator plate means fixedly mounted adjacent said transistor chip within said package, and a conductor element supported on said insulator plate means and having opposite ends which are connected to said output electrode and said second terminal of said package, respectively, to connect said output electrode and said second terminal, said conductor element having substantially higher inductance in comparison with that of the bonding wire connected between said control electrode and said first terminal so that said input impedance of said transistor device has a negative resistance characteristic with a reduced phase rotation at said frequency which has no relation to an external circuit connected to said second terminal of the package.

2. The transistor device as claimed in claim 1, wherein said conductor element is a wire, and said insulator plate means is provided with a plurality of conductive pads formed thereon, said wire being bonded at a plurality of positions thereof to said conductive pads.

3. The transistor device as claimed in claim 2, wherein said insulator plate means comprises a plurality of separate plate sections.

4. The transistor device as claimed in claim 1, wherein said conductor element is a micro-strip line formed on said insulator plate means.

5. The transistor device as claimed in claim 1, wherein said transistor chip is a gallium-arsenide Schottky-barrier gate field-effect transistor chip, said control electrode being a gate electrode, said output electrode being a drain electrode.

6. The transistor device as claimed in claim 5, wherein said package has a metal bottom plate as a ground terminal, said transistor chip being mounted on said metal bottom plate so that a source electrode of said transistor chip is directly connected to said metal bottom plate.

7. The transistor device as claimed in claim 5, wherein said frequency is higher than the X band which is a radio frequency band extending from 5,200 to 10,900 MHz.

8. The transistor device as claimed in claim 7, wherein said conductor element is selected to have an inductance of about 4–5 nH.

* * * * *